(12) United States Patent
Kumano

(10) Patent No.: US 7,965,747 B2
(45) Date of Patent: Jun. 21, 2011

(54) LASER LIGHT SOURCE APPARATUS

(75) Inventor: Koji Kumano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 8 days.

(21) Appl. No.: 12/490,640

(22) Filed: Jun. 24, 2009

(65) Prior Publication Data

US 2009/0323742 A1    Dec. 31, 2009

(30) Foreign Application Priority Data

Jun. 30, 2008 (JP) .................. 2008-170681

(51) Int. Cl.
*H01S 3/04* (2006.01)
(52) U.S. Cl. .................. 372/34; 372/35; 372/36
(58) Field of Classification Search ........... 372/34–36
See application file for complete search history.

(56) References Cited

U.S. PATENT DOCUMENTS

| | | | | |
|---|---|---|---|---|
| 5,481,556 A | * | 1/1996 | Daikuzono | 372/34 |
| 5,550,853 A | * | 8/1996 | Ostler | 372/34 |
| 5,901,167 A | * | 5/1999 | Sukhman et al. | 372/58 |
| 7,415,051 B1 | * | 8/2008 | Risser et al. | 372/34 |
| 2002/0018497 A1 | * | 2/2002 | Naito et al. | 372/34 |
| 2002/0167978 A1 | * | 11/2002 | Nomoto | 372/36 |
| 2003/0021312 A1 | * | 1/2003 | Gruzdev et al. | 372/39 |
| 2005/0013328 A1 | * | 1/2005 | Jurgensen | 372/6 |
| 2005/0123011 A1 | * | 6/2005 | Sukhman et al. | 372/34 |

FOREIGN PATENT DOCUMENTS

| | | | |
|---|---|---|---|
| JP | 402025082 A | * | 7/1988 |
| JP | 401021983 A | * | 1/1989 |
| JP | 5-81821 B2 | | 11/1993 |
| JP | 2007-115020 A | | 5/2007 |

* cited by examiner

*Primary Examiner* — Minsun Harvey
*Assistant Examiner* — Delma R Forde
(74) *Attorney, Agent, or Firm* — Birch, Stewart, Kolasch & Birch, LLP.

(57) ABSTRACT

A laser light source apparatus includes a laser light source; a heat exchanger that includes a plurality of cooling fins and that cools the laser light source; a driving circuit that drives the laser light source; a housing including an intake port and an exhaust port; and an air-cooling fan that is attached to the housing and that discharges air taken in from the intake port to the exhaust port. The cooling fins are arranged at a position opposed to the intake port to be stacked up on each other at predetermined intervals and a pitch between the cooling fins is equal to or less than a minimum width of the intake port.

4 Claims, 3 Drawing Sheets

LASER LIGHT SOURCE APPARATUS

BACKGROUND OF THE INVENTION

1. Field of the Invention

The present invention relates to cooling a heat source in a laser light source apparatus.

2. Description of the Related Art

With a conventional technology, a filter is arranged near an air intake port of a housing to reduce an amount of dust entering the housing (see, for example, Japanese Patent Application Laid-open No. 2007-115020).

However, because typical filters are made of materials, such as fibers, different from those used to make a housing or internal components, usage of the filter disadvantageously increases the number of types of the required materials and the number of components, which increases manufacturing costs.

SUMMARY OF THE INVENTION

It is an object of the present invention to at least partially solve the problems in the conventional technology.

According to an aspect of the present invention, there is provided a laser light source apparatus including a laser light source; a heat exchanger that includes a plurality of cooling fins and that cools the laser light source; a driving circuit that drives the laser light source; a housing that accommodates the laser light source, the heat exchanger, and the driving circuit and that has an intake port and an exhaust port; and an air-cooling fan that is attached to the housing and that discharges air taken in from the intake port to the exhaust port to circulate the air inside the housing. The cooling fins are arranged at a position opposed to the intake port to be stacked up on each other at predetermined intervals, and a pitch between the cooling fins is equal to or less than a minimum width of the intake port.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of the present invention are described in detail below with reference to the accompanying drawings.

Figure 1:
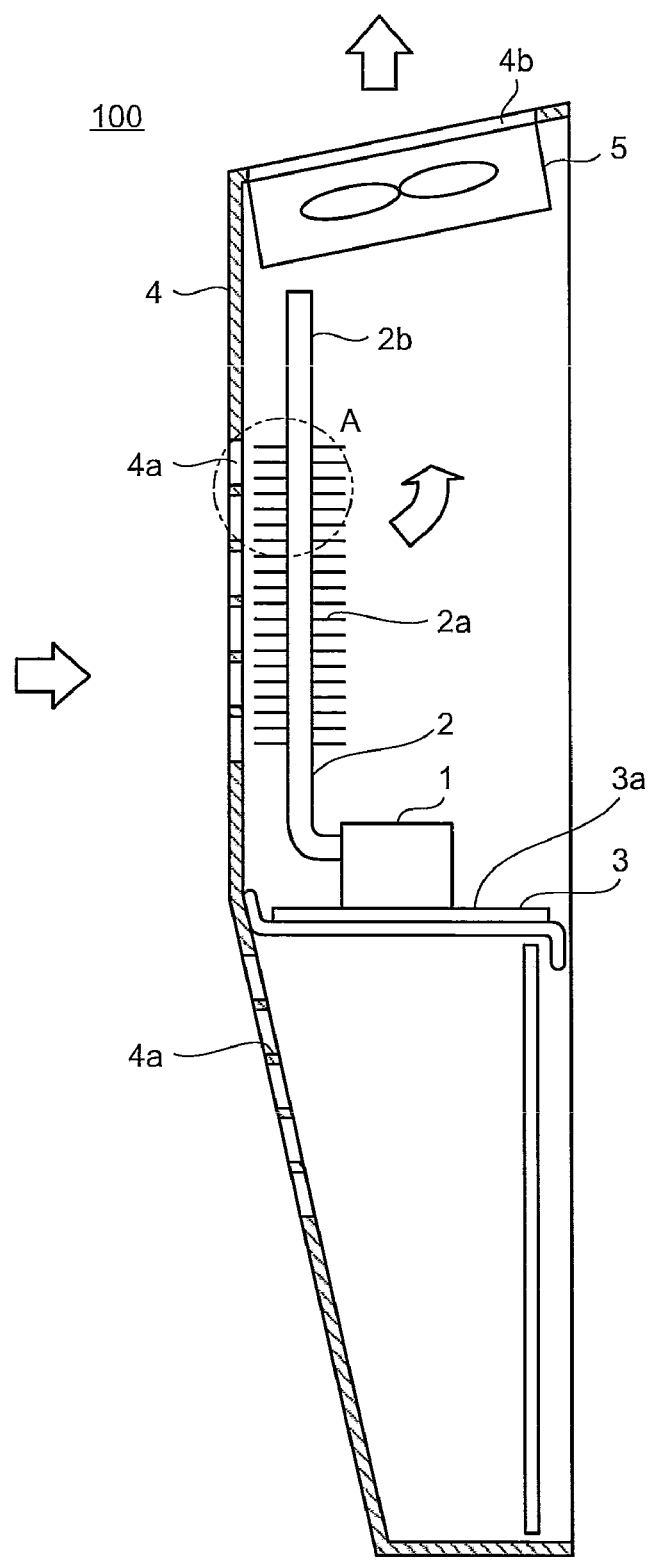
FIG. 1 is a schematic side view of an internal configuration of a laser light source apparatus according to an embodiment of the present invention.
Figure 2:
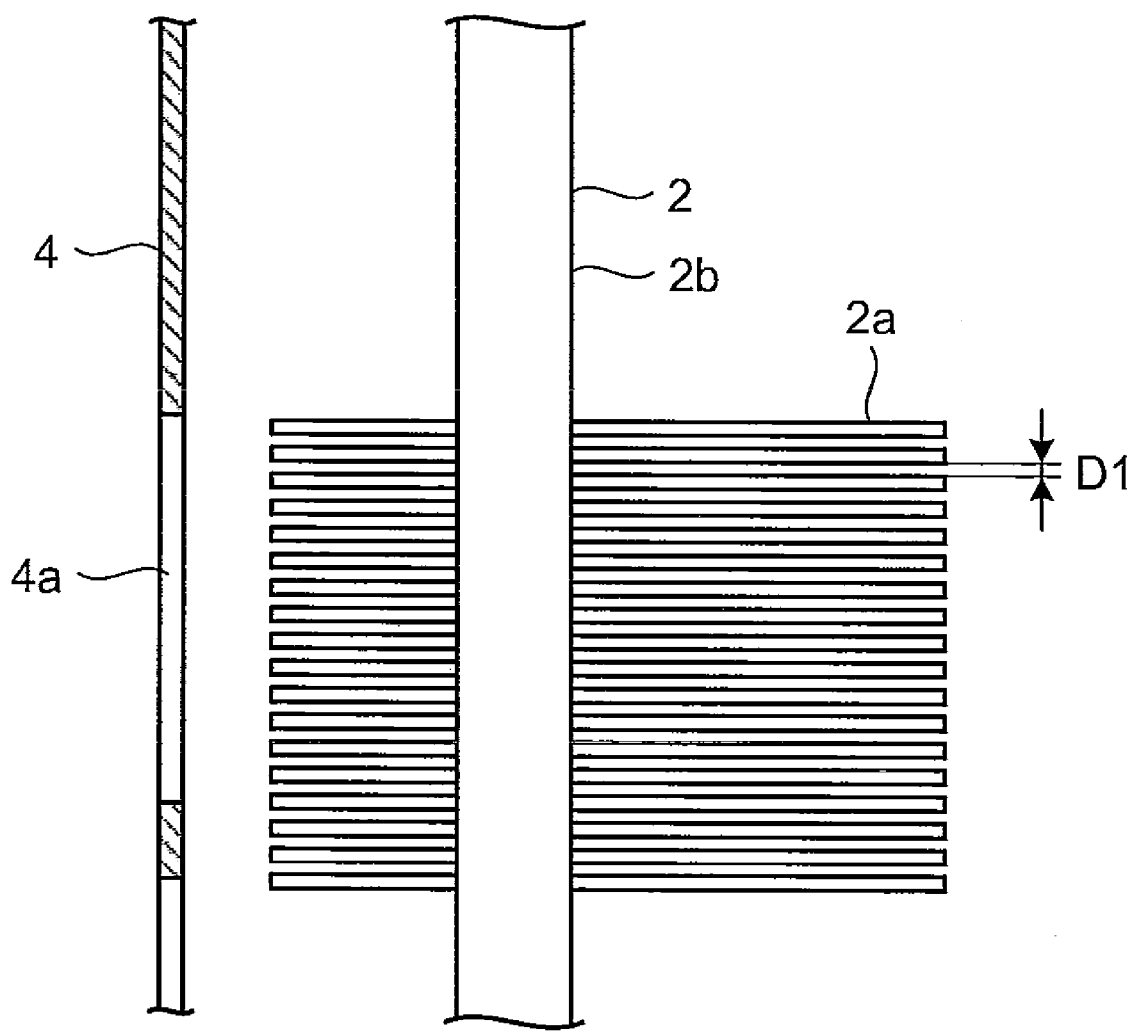
FIG. 2 is a magnified view of a part A depicted in FIG. 1 for explaining the characteristic feature of the laser light source apparatus according to the embodiment.
Figure 3:
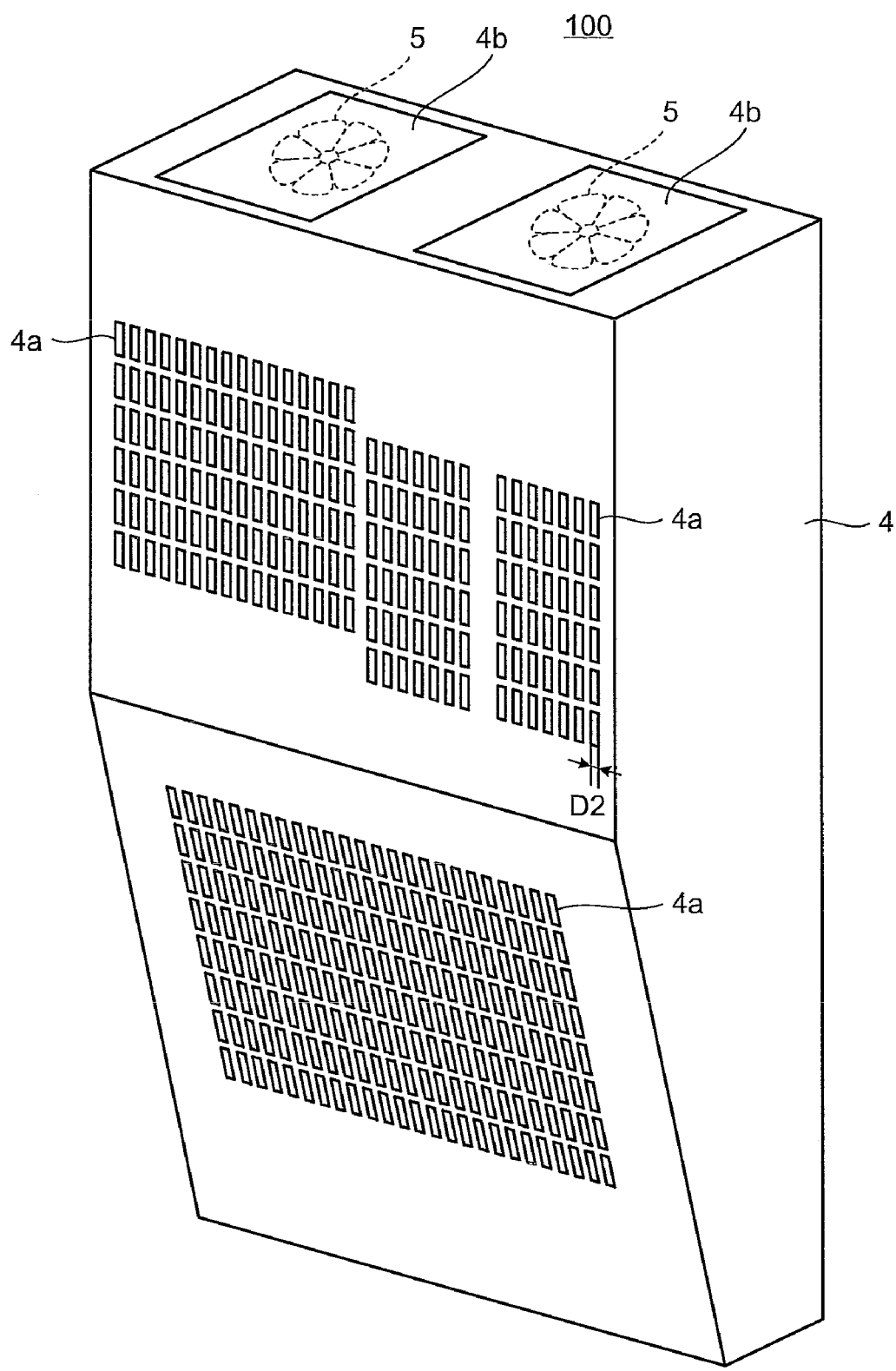
FIG. 3 is a perspective view of the laser light source apparatus according to the embodiment.

FIG. 1 is a schematic side view of an internal configuration of a laser light source apparatus 100 according to an embodiment of the present invention. FIG. 2 is a magnified view of a part A depicted in FIG. 1 for explaining the characteristic feature of the laser light source apparatus 100. FIG. 3 is a perspective view of the laser light source apparatus 100.

The laser light source apparatus 100 is used as a source of laser light in projection imaging devices such as televisions or display devices. The laser light source apparatus 100 includes a laser light source 1 that emits laser light; a heat exchanger 2 that cools the laser light source 1; a base plate 3 on which the laser light source 1 and a driving circuit 3a for driving the laser light source 1 are mounted; and a housing 4 that accommodates the laser light source 1, the heat exchanger 2, and the base plate 3. The heat exchanger 2 is attached to the laser light source 1 to cool the laser light source 1.

Although only one laser light source 1 is shown in FIG. 1, in fact, three laser light sources 1 are arranged in the direction orthogonal to the plane of FIG. 1 to produce three primary colors, i.e., red (R), green (G), and blue (B). Each of the laser light sources 1 includes the heat exchanger 2. In particular, two heat exchangers 2 are attached to the laser light source 1 that produces blue laser light. The laser light that is produced by the laser light sources 1 is guided outside of the laser light source apparatus 100 by optical fibers (not shown).

As depicted in FIG. 3, many intake ports 4a are formed in a first side surface of the housing 4. The intake ports 4a are small ports having an elongated rectangular shape and are formed in substantially the entire first side surface of the housing 4. Two exhaust ports 4b are formed in a second side surface of the housing 4. Air-cooling fans 5 are provided inside the two exhaust ports 4b, respectively. The air-cooling fans 5 circulate air that enters the housing 4 from the intake ports 4a and discharges the air outside of the housing 4 from the exhaust ports 4b as illustrated with arrows in FIG. 1.

Each of the heat exchangers 2 includes at least one heat pipe 2b extending from the laser light source 1 toward the exhaust ports 4b and many cooling fins 2a that are attached to the heat pipe 2b. The heat pipes 2b extending from the laser light sources 1 are arranged side by side inside the housing 4 near the first side surface on which the intake ports 4a are formed. As depicted in FIG. 2, the cooling fins 2a are arranged orthogonal to the first side surface. A pitch D1 between the cooling fins 2a is equal to or less than a minimum width D2 indicative of a length of a smaller side of the intake port 4a shown in FIG. 3.

The operation of the laser light source apparatus 100 will be described below. When outside air is taken into the housing 4 from the intake ports 4a by rotation of the air-cooling fans 5, the intake air passes through between the cooling fins 2a. Because the cooling fins 2a are arranged near the first side surface to cover the intake ports 4a, the cooling fins 2a can also serve as a filter. In this way, the cooling fins 2a prevent dust that is larger than the pitch D1 from coming inside the housing 4.

As described above, the laser light source apparatus 100 includes the heat exchangers 2 and the air-cooling fans 5. Each of the heat exchangers 2 includes the cooling fins 2a that cool the laser light sources 1. The air-cooling fans 5, which are attached to the second side surface of the housing 4, discharge the air taken in from the intake ports 4a to the exhaust ports 4b to circulate the air inside the housing 4. The cooling fins 2a are arranged at a position opposed to the intake ports 4a to be stacked up on each other at predetermined intervals. The pitch D1 between the cooling fins 2a is equal to or less than the minimum width D2 of the intake port 4a, which makes the cooling fins 2a serve as the filter. Accordingly, the filter, which is a necessary component in the conventional laser light source apparatus, is not required in the laser light source apparatus 100 according to the embodiment. In this manner, an amount of dust entering inside the housing 4 is reduced without increasing the number of types of the required materials and the number of the required components.

Moreover, because the cooling fins 2a are arranged orthogonal to the first side surface of the housing 4, the air taken in from the intake port 4a is circulated without being disturbed. Accordingly, the air passes through the housing 4 smoothly, which allows the cooling efficiency to be maintained.

Furthermore, because the cooling fins 2a are arranged in an air path through which the air taken in from the intake ports 4a and discharged from the exhaust ports 4b passes, a good cooling operation of the heat exchanger 2 is performed. Because the cooling fins 2a are arranged inside the housing 4 to cover the intake ports 4a, it is possible for the cooling fins 2a to effectively act as a filter.

In the laser light source apparatus 100, the cooling fins 2a are arranged orthogonal to the first side surface of the housing 4 in which the intake ports 4a are formed; however, the configuration is not limited thereto. For example, the cooling fins 2a can be arranged to be inclined to the intake ports 4a. In this case, a pitch of projections obtained when the cooling fins 2a are projected on the first side surface from the direction parallel to the cooling fins 2a preferably be equal to or less than the minimum width D2 of the intake port 4a. With this configuration, it is possible to obtain the similar advantages as the above in which the cooling fins 2a act as a filter and to improve the cooling operation because the air taken in from the intake ports 4a reliably contacts the surface of the cooling fins 2a.

As described above, the laser light source apparatus according to the embodiment accommodates a laser light source, a driving circuit, or the like in a housing and includes a heat exchangers that cools the laser light source. The laser light source apparatus is suitable for use as a source of laser light in projection imaging devices such as televisions and display devices.

According to an aspect of the present invention, air taken in from outside by an air-cooling fan passes through between cooling fins. Therefore, the cooling fins also act as a filter.

Moreover, the filter, which is a necessary component in the conventional laser light source apparatus, is not required; therefore, an amount of dust entering inside a housing is reduced without increasing the number of types of the required materials and the number of the required components.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A laser light source apparatus comprising:
   a laser light source;
   a driving circuit that drives the laser light source;
   a heat exchanger that cools the laser light source and the driving circuit through the laser light source, the heat exchanger including at least one heat pipe extending from the laser light source and a plurality of cooling fins attached to the at least one heat pipe;
   a housing that accommodates the laser light source, the heat exchanger, and the driving circuit and that has an intake port and an exhaust port; and
   an air-cooling fan that is attached to the housing and that discharges air taken in from the intake port to the exhaust port to circulate the air inside the housing, wherein
   the cooling fins are arranged at a position opposed to the intake port to be stacked up on each other at predetermined intervals, and a pitch between the cooling fins is equal to or less than a minimum width of the intake port.

2. A laser light source apparatus comprising:
   a laser light source;
   a heat exchanger that includes a plurality of cooling fins and that cools the laser light source;
   a driving circuit that drives the laser light source;
   a housing that accommodates the laser light source, the heat exchanger, and the driving circuit and that has an intake port and an exhaust port; and
   an air-cooling fan that is attached to the housing and that discharges air taken in from the intake port to the exhaust port to circulate the air inside the housing, wherein
   the cooling fins are arranged at a position opposed to the intake port to be stacked up on each other at predetermined intervals, and a pitch between the cooling fins is equal to or less than a minimum width of the intake port, wherein
   the cooling fins are inclined with respect to the side surface of the housing in which the intake port is formed, and
   a pitch of projections obtained when the cooling fins are projected on the side surface of the housing is from the direction parallel to the cooling fins is equal to or less than the minimum width of the intake port.

3. A laser light source apparatus comprising:
   a laser light source;
   a heat exchanger that includes a plurality of cooling fins and that cools the laser light source;
   a driving circuit that drives the laser light source;
   a housing that accommodates the laser light source, the heat exchanger, and the driving circuit and that has an intake port and an exhaust port; and
   an air-cooling fan that is attached to the housing and that discharges air taken in from the intake port to the exhaust port to circulate the air inside the housing, wherein
   the cooling fins are arranged at a position opposed to the intake port to be stacked up on each other at predetermined intervals. and a pitch between the cooling fins is equal to or less than a minimum width of the intake port, wherein the cooling fins are arranged inside the housing to cover the intake port.

4. The laser light source apparatus according to claim 1, wherein the cooling fins are arranged in an air path through which the air is taken in from the intake port and is discharged from the exhaust port.

* * * * *